United States Patent
Rowan et al.

(10) Patent No.: US 12,153,183 B2
(45) Date of Patent: Nov. 26, 2024

(54) MACHINE LEARNING PROXY MODEL FOR PARAMETER TUNING IN OILFIELD PRODUCTION OPERATIONS

(71) Applicant: Schlumberger Technology Corporation, Sugar Land, TX (US)

(72) Inventors: David Rowan, Abingdon (GB); Rajarshi Banerjee, Houston, TX (US); Omer Gurpinar, Denver, CO (US); Bulent Balci, London (GB); Gino Camillus Thielens, Houston, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 18/564,182

(22) PCT Filed: May 27, 2022

(86) PCT No.: PCT/US2022/072616
§ 371 (c)(1),
(2) Date: Nov. 27, 2023

(87) PCT Pub. No.: WO2022/251875
PCT Pub. Date: Dec. 1, 2022

(65) Prior Publication Data
US 2024/0248235 A1 Jul. 25, 2024

Related U.S. Application Data

(60) Provisional application No. 63/202,113, filed on May 27, 2021.

(51) Int. Cl.
*G01V 20/00* (2024.01)
*E21B 4/00* (2006.01)
(Continued)

(52) U.S. Cl.
CPC .............. *G01V 20/00* (2024.01); *E21B 43/00* (2013.01); *E21B 4/00* (2013.01); *E21B 41/00* (2013.01);
(Continued)

(58) Field of Classification Search
CPC ...... G01V 20/00; G01V 2210/66; G01V 3/38; G01V 99/00; E21B 43/00; E21B 2200/00;
(Continued)

(56) References Cited

U.S. PATENT DOCUMENTS

| 10,364,662 B1 * | 7/2019 | Basu ...................... G01V 20/00 |
| 2009/0020284 A1 * | 1/2009 | Graf ...................... E21B 44/00 |
| | | 166/250.15 |

(Continued)

FOREIGN PATENT DOCUMENTS

| WO | WO-2017223483 A1 * | 12/2017 | |
| WO | WO-2021093976 A1 * | 5/2021 | ............. E21B 43/12 |

OTHER PUBLICATIONS

Shahkarami et al. (Applications of smart proxies for subsurface modeling, Petroleum Exploration and Development, vol. 47, Issue 2, 2020, pp. 400-412, ISSN 1876-3804, https://doi.org/10.1016/S1876-3804(20)60057-X) (Year: 2020).*

*Primary Examiner* — Manish S Shah
*Assistant Examiner* — Christian T Bryant

(57) ABSTRACT

A method includes training a proxy model to predict output from a reservoir model of a subterranean volume, receiving data representing an oilfield operation performed at least partially in the subterranean volume, predicting one or more performance indicators for the oilfield operation using the proxy model, and updating the reservoir model based at least in part on the one or more performance indicators predicted in the proxy model.

18 Claims, 9 Drawing Sheets

(51) Int. Cl.
  *E21B 41/00*   (2006.01)
  *E21B 43/00*   (2006.01)
  *E21B 44/02*   (2006.01)
  *E21B 49/00*   (2006.01)
  *G01V 3/38*    (2006.01)
  *G01V 99/00*   (2024.01)
  *G06F 30/27*   (2020.01)
  *G06Q 10/04*   (2023.01)

(52) U.S. Cl.
  CPC .............. *E21B 44/02* (2013.01); *E21B 49/00* (2013.01); *E21B 49/003* (2013.01); *E21B 2200/20* (2020.05); *G01V 3/38* (2013.01); *G01V 99/00* (2013.01); *G01V 2210/66* (2013.01); *G06F 30/27* (2020.01); *G06Q 10/04* (2013.01)

(58) Field of Classification Search
  CPC . E21B 49/00; E21B 41/00; E21B 4/00; E21B 49/003; E21B 44/02; G06F 30/27; G06Q 10/04
  See application file for complete search history.

(56) References Cited

U.S. PATENT DOCUMENTS

| | | | |
|---|---|---|---|
| 2010/0161300 A1* | 6/2010 | Yeten | E21B 43/00 703/10 |
| 2011/0139464 A1* | 6/2011 | Henderson | E21B 47/10 166/370 |
| 2012/0253770 A1* | 10/2012 | Stern | G06F 30/20 703/10 |
| 2021/0027144 A1* | 1/2021 | Madasu | G06F 30/20 |

* cited by examiner

MACHINE LEARNING PROXY MODEL FOR PARAMETER TUNING IN OILFIELD PRODUCTION OPERATIONS

CROSS-REFERENCE TO RELATED APPLICATIONS

This application claims priority to U.S. Provisional Patent Application having Ser. No. 63/202,113, which was filed on May 27, 2021 and is incorporated herein by reference in its entirety.

BACKGROUND

Oilfield exploration and production efforts generally include collecting data that represents a subsurface volume of interest, and then modeling the physical characteristics of the subsurface volume based on the data. There are many sources for such data, including seismic surveys and well logs. This data permits complex models to be built, which may depict the geology of the subsurface volume, fluid migration over time in the volumes, and other aspects. Because of the high complexity of the models, even with extensive computing resources, it can take hours or even days to build and simulate conditions in the models. Thus, when the physical characteristics of the subsurface volume change, or when simulating different operating conditions in the model, solving such models can present significant delays.

Accordingly, refining and rebuilding models is frequently done in the exploration and well planning setting, where time and resources are focused on making accurate and precise determinations of where and how to drill a well. The pace of advancement at this stage can be slow, and thus there is both time available and upfront benefit to updating and running the models, prior to drilling.

At the production stage, the models can be helpful in determining operating parameters (e.g., choke positions, injection rates, etc.), but the delay and expense incurred by running the models is frequently too high. Thus, operators tend to make rough estimations for the parameters, based largely on approximations and calculations that use a small sampling of the total available data. Further, these techniques may rely on input and output measurements, without analysis of the factors (e.g., geology) that lead to the output from the input, or the potential for these factors to change. Thus, for example, in a waterflooding context, operators may consider combinations of injection rates and production rates from injection and production wells, respectively, in a given field, and make determinations based on those measurements. Relatively little consideration may be given to the geology of the field, since accounting for the geology generally calls for an accurate model, and accurately modeling the geology and simulating the fluid flow is too costly and slow to be performed with sufficient frequency (e.g., daily) to keep up with the acquisition of new data.

Accordingly, there would be a benefit to systems and methods that permit accurately modeling the subsurface, including the geology, and which are quick enough to be used and updated during operations.

SUMMARY

Embodiments of the disclosure include method including training a proxy model to predict output from a reservoir model of a subterranean volume, receiving data representing an oilfield operation performed at least partially in the subterranean volume, predicting one or more performance indicators for the oilfield operation using the proxy model, and updating the reservoir model based at least in part on the one or more performance indicators predicted in the proxy model.

Embodiments of the disclosure include a computing system including one or more processors, and a memory storing instructions that, when executed by at least one of the one or more processors, cause the computing system to perform operations including training a proxy model to predict output from a reservoir model of a subterranean volume, receiving data representing an oilfield operation performed at least partially in the subterranean volume, predicting one or more performance indicators for the oilfield operation using the proxy model, and updating the reservoir model based at least in part on the one or more performance indicators predicted in the proxy model.

Embodiments of the disclosure include a non-transitory computer-readable medium storing instructions that, when executed by at least one processor of a computing system, cause the computing system to perform operations, the operations including training a proxy model to predict output from a reservoir model of a subterranean volume, receiving data representing an oilfield operation performed at least partially in the subterranean volume, predicting one or more performance indicators for the oilfield operation using the proxy model, and updating the reservoir model based at least in part on the one or more performance indicators predicted in the proxy model.

Thus, the computing systems and methods disclosed herein are more effective methods for processing collected data that may, for example, correspond to a surface and a subsurface region. These computing systems and methods increase data processing effectiveness, efficiency, and accuracy. Such methods and computing systems may complement or replace conventional methods for processing collected data. This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

The accompanying drawings, which are incorporated in and constitute a part of this specification, illustrate embodiments of the present teachings and together with the description, serve to explain the principles of the present teachings. In the figures.

DETAILED DESCRIPTION

Figure 1:
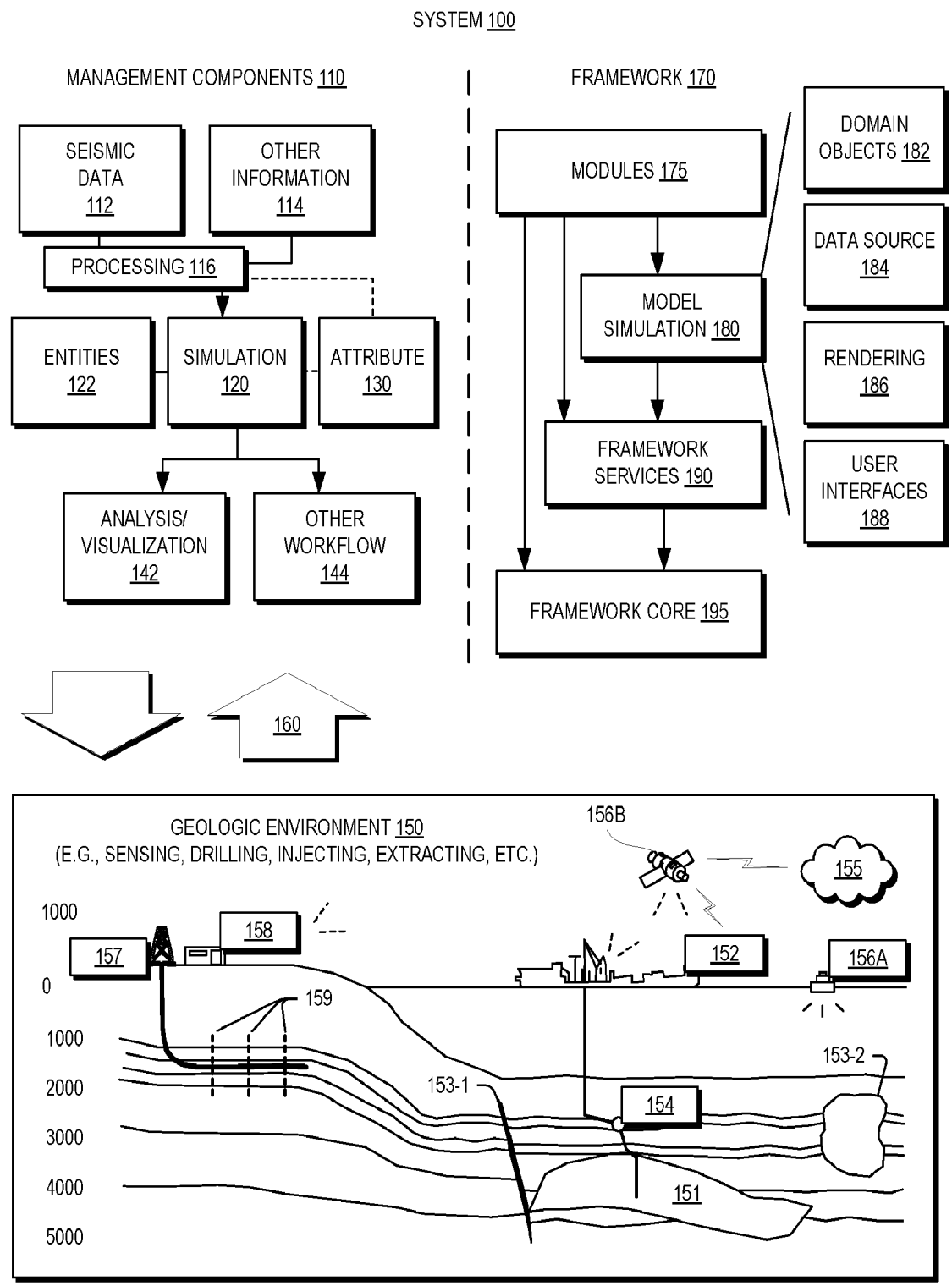
FIG. 1 illustrates an example of a system that includes various management components to manage various aspects of a geologic environment, according to an embodiment.

Embodiments of the present disclosure may provide a system and method for controlling oilfield operations, e.g., production operations such as waterflooding. For example, the systems and methods may provide for evaluation of performance of the ongoing production operations, so as to identify and implement field-actions that increase efficiency. The system may connect engineering evaluations with the reservoir models in an on-time or real-time basis. Further, the system updates and accesses reservoir model(s) automatically. Embodiments also include an analyser system that includes data and engines for storage and management of static and dynamic data, models, and computational engines such as reservoir simulators. Further, systems and methods for agile reservoir modelling for creating, updating, calibrating, and executing reservoir simulation model related to the ongoing waterflooding is disclosed. Artificial intelligence (AI) driven enhancements for creating and updating machine learning (ML) driven proxy models, are also disclosed. Systems and methods for translating and communicating the reservoir model outcomes to the operation management are also provided. Further, surveillance, operation management and decision dashboards for visualization of decisions, performance indicators, results, etc., are provided.

Reference will now be made in detail to embodiments, examples of which are illustrated in the accompanying drawings and figures. In the following detailed description, numerous specific details are set forth in order to provide a thorough understanding of the invention. However, it will be apparent to one of ordinary skill in the art that the invention may be practiced without these specific details. In other instances, well-known methods, procedures, components, circuits, and networks have not been described in detail so as not to unnecessarily obscure aspects of the embodiments.

It will also be understood that, although the terms first, second, etc. may be used herein to describe various elements, these elements should not be limited by these terms. These terms are only used to distinguish one element from another. For example, a first object or step could be termed a second object or step, and, similarly, a second object or step could be termed a first object or step, without departing from the scope of the present disclosure. The first object or step, and the second object or step, are both, objects or steps, respectively, but they are not to be considered the same object or step.

The terminology used in the description herein is for the purpose of describing particular embodiments and is not intended to be limiting. As used in this description and the appended claims, the singular forms "a," "an" and "the" are intended to include the plural forms as well, unless the context clearly indicates otherwise. It will also be understood that the term "and/or" as used herein refers to and encompasses any possible combinations of one or more of the associated listed items. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Further, as used herein, the term "if" may be construed to mean "when" or "upon" or "in response to determining" or "in response to detecting," depending on the context.

Attention is now directed to processing procedures, methods, techniques, and workflows that are in accordance with some embodiments. Some operations in the processing procedures, methods, techniques, and workflows disclosed herein may be combined and/or the order of some operations may be changed.

FIG. 1 illustrates an example of a system 100 that includes various management components 110 to manage various aspects of a geologic environment 150 (e.g., an environment that includes a sedimentary basin, a reservoir 151, one or more faults 153-1, one or more geobodies 153-2, etc.). The system 100 may also include a framework 170, as discussed below. For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142 and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, bodies, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may operate in conjunction with a software framework such as an object-based framework. In such a framework, entities may include entities based on pre-defined classes to facilitate modeling and simulation. A commercially available example of an object-based framework is the MICROSOFT© .NET© framework (Redmond, Washington), which provides a set of extensible object classes. In the .NET© framework, an object class encapsulates a module of reusable code and associated data structures. Object classes can be used to instantiate object instances for use in a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results (e.g., simulation results, etc.). As an example, output from the simulation component 120 may be input to one or more other workflows, as indicated by a workflow component 144.

As an example, the simulation component 120 may include one or more features of a simulator such as the ECLIPSE™ reservoir simulator (Schlumberger Limited, Houston Texas), the INTERSECT™ reservoir simulator (Schlumberger Limited, Houston Texas), etc. As an example, a simulation component, a simulator, etc. may include features to implement one or more meshless techniques (e.g., to solve one or more equations, etc.). As an example, a reservoir or reservoirs may be simulated with respect to one or more enhanced recovery techniques (e.g., consider a thermal process such as SAGD, etc.).

In an example embodiment, the management components 110 may include features of a commercially available framework such as the PETREL© seismic to simulation software framework (Schlumberger Limited, Houston, Texas). The PETREL© framework provides components that allow for optimization of exploration and development operations. The PETREL© framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of modeling, simulating, etc.).

In an example embodiment, various aspects of the management components 110 may include add-ons or plug-ins that operate according to specifications of a framework environment. For example, a commercially available framework environment marketed as the OCEAN© framework environment (Schlumberger Limited, Houston, Texas) allows for integration of add-ons (or plug-ins) into a PETREL© framework workflow. The OCEAN© framework environment leverages .NET© tools (Microsoft Corporation, Redmond, Washington) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of the framework 170, which includes a model simulation layer 180 along with a framework services layer 190, a framework core layer 195, and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization.

As an example, a framework may include features for implementing one or more mesh generation techniques. For example, a framework may include an input component for receipt of information from interpretation of seismic data, one or more attributes based at least in part on seismic data, log data, image data, etc. Such a framework may include a mesh generation component that processes input information, optionally in conjunction with other information, to generate a mesh.

In the example of FIG. 1, the model simulation layer 180 may provide domain objects 182, act as a data source 184, provide for rendering 186, and provide for various user interfaces 188. Rendering 186 may provide a graphical environment in which applications can display their data while the user interfaces 188 may provide a common look and feel for application user interface components.

As an example, the domain objects 182 can include entity objects, property objects and optionally other objects. Entity objects may be used to geometrically represent wells, surfaces, bodies, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may include layers (e.g., stratification) that include a reservoir 151 and one or more other features such as the fault 153-1, the geobody 153-2, etc. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156A may be located remote from a well site and include sensing, detecting, emitting or other circuitry. Such equipment may include storage and communication circuitry to store and to communicate data, instructions, etc. As an example, one or more satellites 156B may be provided for purposes of communications, data acquisition, etc. For example, FIG. 1 shows a satellite 156B in communication with the network 155 that may be configured for communications, noting that the satellite may additionally or instead include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a workflow may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL® software, for example, that operates on seismic data, seismic attribute(s), etc. As an example, a workflow may be a process implementable in the OCEAN® framework. As an example, a workflow may include one or more worksteps that access a module such as a plug-in (e.g., external executable code, etc.).

Figure 2:
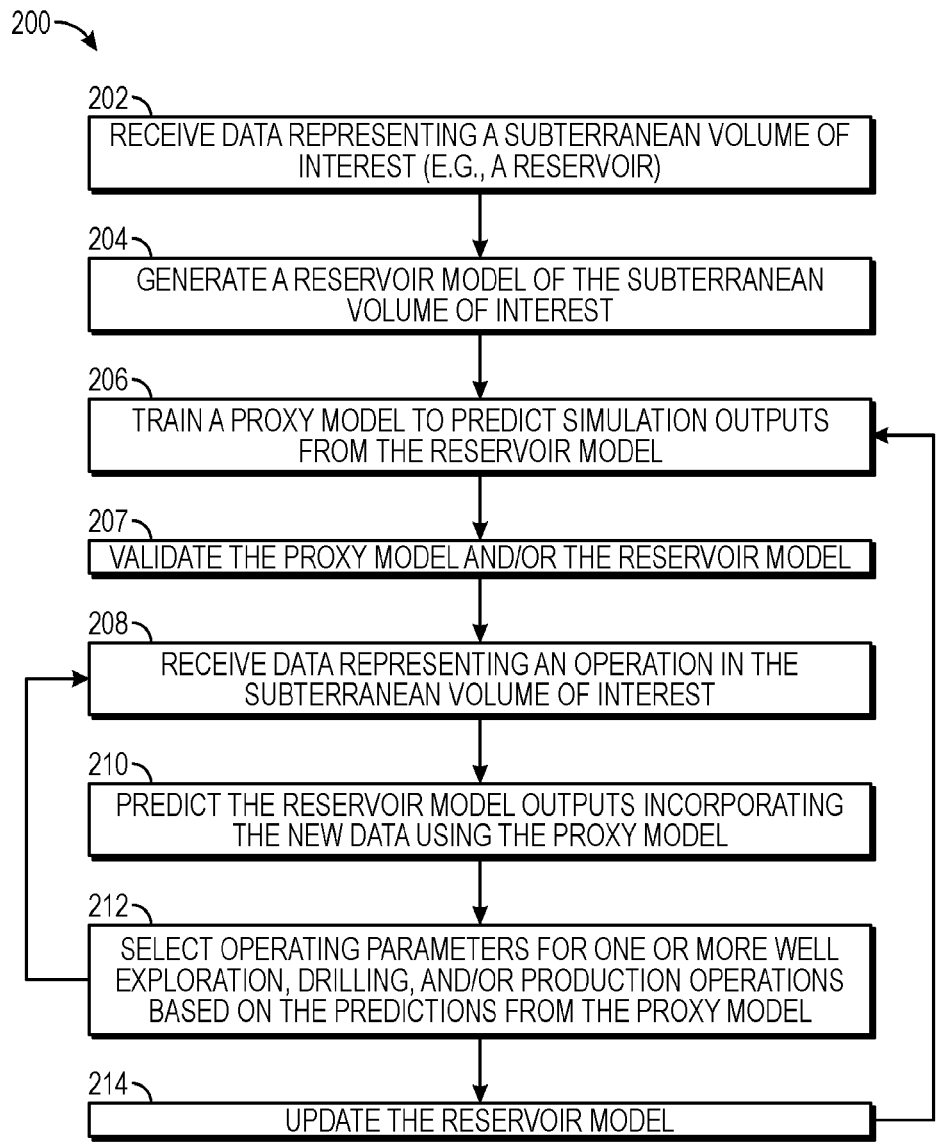
FIG. 2 illustrates a flowchart of a method for controlling parameters in an oilfield operation, according to an embodiment.

FIG. 2 illustrates a flowchart of a method 200 for controlling parameters in an oilfield operation, according to an embodiment. In some embodiments, the oilfield operation may be a production ("recovery") operation and, as one example among many possible production operations, a waterflooding operation. Other operations might include other well treatments, fracturing operations, etc. Waterflooding, by way of example, is a process by which water is injected through injection wells in a field, which applies pressure to the hydrocarbons so as to move the hydrocarbons from the reservoir rock and into production wells for extraction. Parameters in various types of production operations may be controlled by physically adjusting the equipment that is being used to conduct the operations.

The method 200 may include receiving data representing a subterranean volume of interest (e.g., a reservoir), as at 202. The data, as noted above, may be collected from a variety of sources, including seismic surveys, well logs, core samples, LiDAR surveys, satellite imagery, gravity surveys, etc. The data may represent the subterranean volume in that it provides information that can be used to calculate or estimate one or more physical characteristics of the volume.

Accordingly, based on the data, a numerical, physics-based model (e.g., a reservoir model) of the subterranean volume of interest may be constructed, as at 204. For example, the reservoir model incorporates a geological model obtained from a database. The reservoir model may be configured to simulate fluid flow (or any other physical process) in the volume of interest, based on the dynamics of the fluid flow, the geology of the volume, and any other relevant factors. The model is referred to as "physics-based" because it relies on physics to yield outputs, e.g., it organizes and permits modeling of a multiphase fluid flow through calculation of equations of state, fluid dynamics, etc. Thus, the output may be calculated (e.g., deterministically) from the input parameters.

The method 200 may also include training a proxy model to predict model outputs, as at 206. The proxy model is created based on the numerical reservoir model, which has been calibrated to historical performance, and may be a surrogate for the reservoir model. Multiple realizations of the reservoir model may be employed to build and train the proxy model, for example, tens or thousands of runs. The data obtained from the numerical model is used to train the proxy model. Various different algorithms may be used in the proxy model, for example, artificial numerical network (ANN), or another type of machine learning model.

In some embodiments, the proxy model may be validated, as at 207. This may be done, for example, by analyzing the confidence levels of the outputs of the proxy model (e.g., a numerical measure provided by the model, which measures how likely the prediction is to be accurate, based on the machine learning model's training and composition), comparing the proxy model outputs to the reservoir model outputs (e.g., model realizations not used to train the proxy model), etc. If the proxy model is validated, e.g., based upon relatively high confidence levels and relatively high correlations between proxy model outputs and reservoir model outputs, the method 200 may continue. If it is not, the method 200 may, in some embodiments, return to training the proxy model, e.g., by providing additional training data thereto.

The method 200 may further include receiving new data representing an operation in the subterranean volume of interest, as at 208. The new data may be received on a continuous basis, e.g., roughly hourly, daily, monthly, etc. It may be desirable to understand the impact the new data has on the reservoir model outputs, without having to expend the time and resources to simulate the reservoir model. Continuing with the example of waterflooding, the data may be injection rates/pressures, choke positions, production rates/pressures, changes in geological conditions, etc. For example, in the example of waterflooding, waterflood pattern balancing can be performed, e.g., executed daily by accessing daily injection and production rates.

The method 200 may then include predicting the reservoir model outputs, in view of (incorporating) the new data, using the trained proxy model, as at 210. Continuing with the waterflood operation example, given the injection pressures, the trained proxy model may predict the production rate from individual production wells (or as a whole). Additionally, the proxy model may predict injection schemes that enhance production under set of constraints, such as bottom hole pressures and reservoir pressures.

The proxy model may call for shorter runtimes, as compared to a complete numerical simulation of the reservoir model, to predict conditions in the subterranean domain. For example, the proxy model generally recognizes patterns, while running the reservoir model may call for many (e.g., millions) of mathematical calculations. Thus, the proxy model can be run more frequently (e.g., daily) than the reservoir model, which may be run monthly, for example. Accordingly, the expected outputs of the reservoir model, e.g., within a calculated value for confidence (or uncertainty), can be predicted using the proxy model and without running the reservoir model. The outputs may be employed to determine performance indicators related to the operation being conducted. Specific examples of such performance indicators include conformance, voidage replacement, maps (e.g., traffic light maps), operation efficiency, curve-fitting, etc.

The method 200 may include selecting an operating parameter for the operations, e.g., based on the predictions from the proxy model, as at 212. For example, the performance indicators can be displayed to users, who can, potentially without having expertise in operating the underlying reservoir model, make determinations as to operating parameter values (e.g., choke positions, injection rates, etc.). In some embodiments, the proxy model can be trained to make the operating parameter determinations and either recommend them or implement them automatically.

The method 200 may also include feeding the changed operating parameters back to the proxy model, as shown by the arrow extending from box 212 back to 208. For example, the implemented operating parameter adjustments may result in different conditions in the oilfield. The reservoir model, were it to be updated at this point, may take such changes into consideration. Thus, the proxy model, to accurately predict the outputs of the reservoir model, may also consider these changed conditions created by adjusted operating parameters. The sequence described above may then proceed again, with the proxy model again providing predictions/recommendations of operating parameters (and/or implementing the operating parameters by automatically adjusting equipment in the production system).

Periodically, the reservoir model may be updated, as at 214. That is, the data collected in the field may be fed to the reservoir model, which may then update its representation of the subterranean volume and the processes that occur therein. The reservoir model may be updated less frequently than the proxy model. The updated reservoir model may then be employed to train the proxy model, as indicated by the arrow extending from box 214 to box 206.

Figure 3:
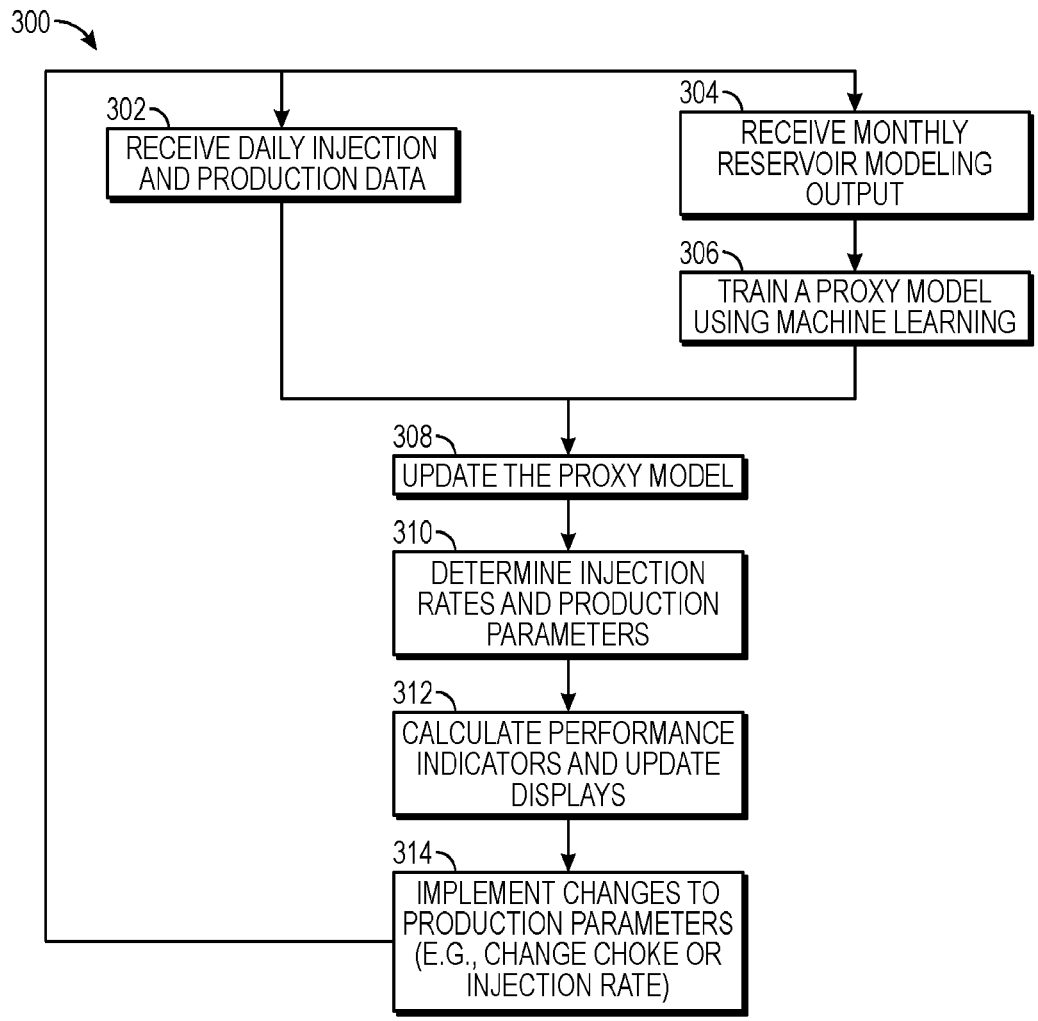
FIG. 3 illustrates another flowchart of a method, according to an embodiment.

FIG. 3 illustrates another flowchart of a method 300, according to an embodiment. The method 300 may be specific to implementations of the present disclosure to waterflooding operations, although it is emphasized that this is merely an example. The method 300 may include receiving daily injection and production data, as at 302. The method 300 may also include receiving monthly reservoir modeling outputs, as at 304, and training the proxy model using machine learning and based on the monthly reservoir modeling outputs, as at 306. Based on the daily data and the training, the proxy model may be updated, as at 308. Next, the proxy model may be employed to determine injection rates and/or other production parameters, as at 310. Further, performance indicators may be calculated and displays based thereon updated, as at 312. Additionally, changes to production indicators may be calculated (e.g., based on relationships with process/operating parameters) and implemented, as at 314, e.g., automatically or by recommendation to a user. For example, the production parameters may be changed by changing choke positions or injection rates.

Figure 4A:
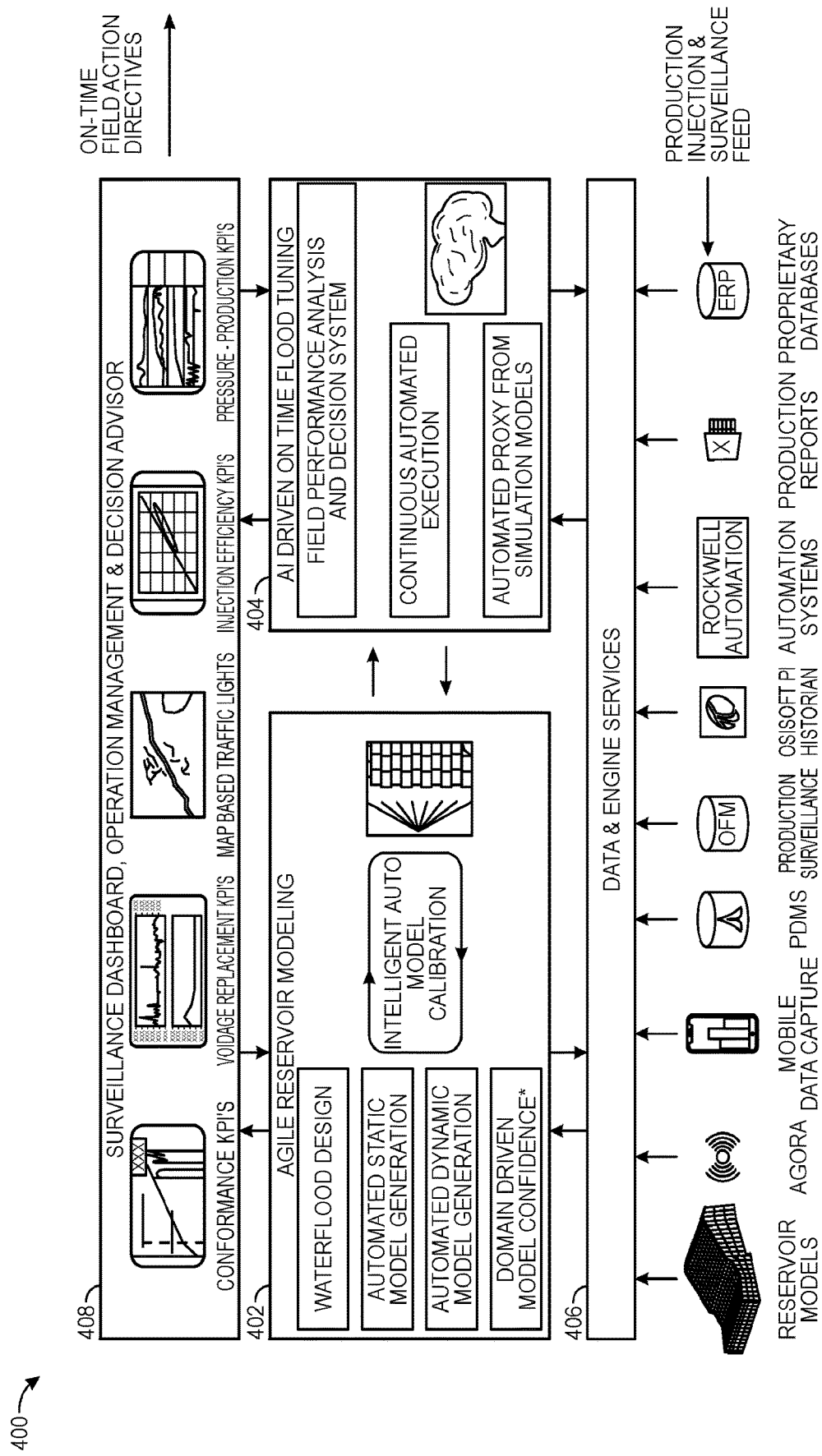
FIG. 4A illustrates a diagram of a system for implementing a proxy model using machine learning, to control a production process, according to an embodiment.

FIG. 4A illustrates a diagram of a system 400 for implementing a proxy model using machine learning, to control a production process, according to an embodiment. The system 400, as shown, may generally include an "agile" reservoir modeling module 402. This module 402 may be configured to generate, update, and simulate the reservoir model, and may do so more frequently than some other, conventional systems, and thus may be referred to as providing "agile" modeling. As noted above, the building and simulating of this model may be relatively computationally expensive, however, as compared to a machine learning/proxy model. The reservoir modeling module 402 may also include a domain driven model confidence module. This module may perform quality checks of the reservoir model that is generated, in order to verify that the reservoir model accurately represents the reservoir being modeled.

An Artificial Intelligence (AI) Driven On-Time Flood Tuning module 404 ("tuning module 404") may communicate with the reservoir modeling module 402. The tuning module 404 may be configured to implement the proxy model, as discussed above. The tuning module 404 may also implement field performance and analysis decision systems as well as provide continuous automated execution.

A variety of data sources are drawn upon to feed the reservoir modeling module 402 and the tuning module 404. These different data sources may be fed into the system 400 via a data and engine services module 406. The data and engine services module 406 may communicate directly with the modules 402, 404, as shown. The data sources may be received from production injection and surveillance feeds, as shown.

The system 400 may also implement an advisor module 408. The advisor module 408 may include a dashboard, which may display various "key" performance indicators ("KPIs"). These indicators, such as conformance, voidage, map-based indicators such as traffic lights, injection efficiency curves, and pressure-production plots, may be employed to inform decisions related to production operations, e.g., parameters, such as choke position and injection rates, among others.

More particularly, the dashboard may provide a comprehensive framework for display of decisions and supporting results. The in-depth analysis ensures confidence in the workflow. Examples of decision outcomes include recommended throughput, expected reservoir pressure, recommended injection rates for individual wells, recommended production rate for individual wells, and action items and status. The dashboard also hosts a list of plots associated with waterflood surveillance. Examples of surveillance plots include 2D/3D map of simulation computed saturation, pressures and streamlines, superposition of traffic lights on the above maps to represent anomalies. (e.g., injection efficiencies of injectors falling below a threshold or water cut of a producer exceeding a certain threshold), daily tracking of production indicators (data against simulation model output), production volume against target, injection volume against target, reservoir pressure against target, cumulative water injection volume, instantaneous VRR against target, water throughput rate against target, percentage of wells within operating envelope. Further, the dashboard can permit daily tracking of operational performance indicators such as injection plant uptime against target, oil in water and TSS against target, chemical injection rates against target, average oxygen content against target, The tuning module 404 may be considered to include a "digital avatar" or replacement/supplement for a human, subject-matter expert or team of experts with reservoir management project experience. The module 404 may thus be a "digital" extension or addition to an operations team. With this addition, waterflood operators may have less numerical modeling and reservoir simulation expertise. Further, performance of the project with on-time connection to the reservoir model(s) may be enhanced. The module 404 may decide how the reservoir model should be utilized, based on the use-case for the operation room. In addition, the module 404 may coordinate the update and creation of new reservoir models and decision models. Once the model runs have completed the module 404 may translate the simulator output to a proxy model, also known as a decision model, that the operation room interacts with. The properties and the capabilities of the proxy model(s) may be predetermined for interaction with the operation room (e.g., fit for purpose modeling).

Figure 4B:
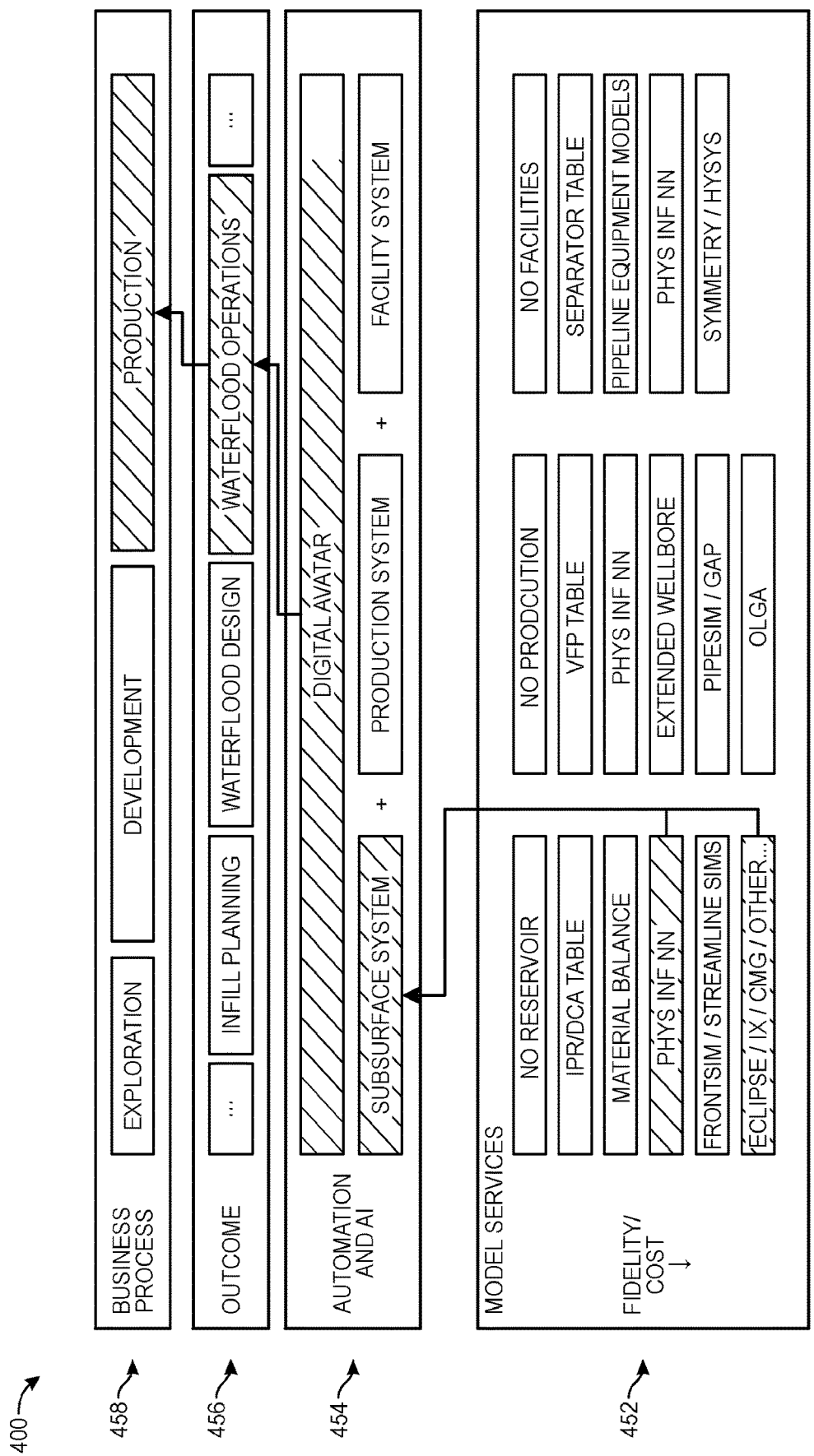
FIG. 4B illustrates a diagram of a system for controlling a production environment, according to an embodiment.

FIG. 4B illustrates a diagram of the operation of the system 400, according to an embodiment. The system 400 may include model services 452 (e.g., part of the reservoir modeling module 402 of FIG. 4A), automation and AI 454 (e.g., part of the tuning module 404 of FIG. 4A), outcome operations 456, and business processes 458. The business processes 458 may be generally related to the type of operation or "phase" that is being undertaken in the environment, e.g., exploration, development, or production. In the present example, production is highlighted, although any other phase could be. In this case, production is highlighted because agile modeling and fast, inexpensive parameter calculations may be beneficial.

Accordingly, the model services 452 may employ a variety of possible models, including both an artificial intelligence/neural network proxy model and a reservoir model, as shown and discussed above. These two models, operating in parallel, may provide information related to the subsurface system conditions, by way of simulation, to the automation and AI 454. The automation and AI 454, executing the "digital avatar" as discussed above, may serve dual purposes. First, it may accept the data from the model services 452 and use it to produce waterflood (or any other type of system, e.g., infill planning) parameters to the physical system, in order to enhance the efficiency of on-going oilfield operations within the business process 458. The digital avatar may also track various performance indicators and other data against the measured data, thereby determining when to rebuild/retrain one of the model services 452 (e.g., based on a lowering of confidence/accuracy eventually indicating that a model is out of date).

Figure 5:
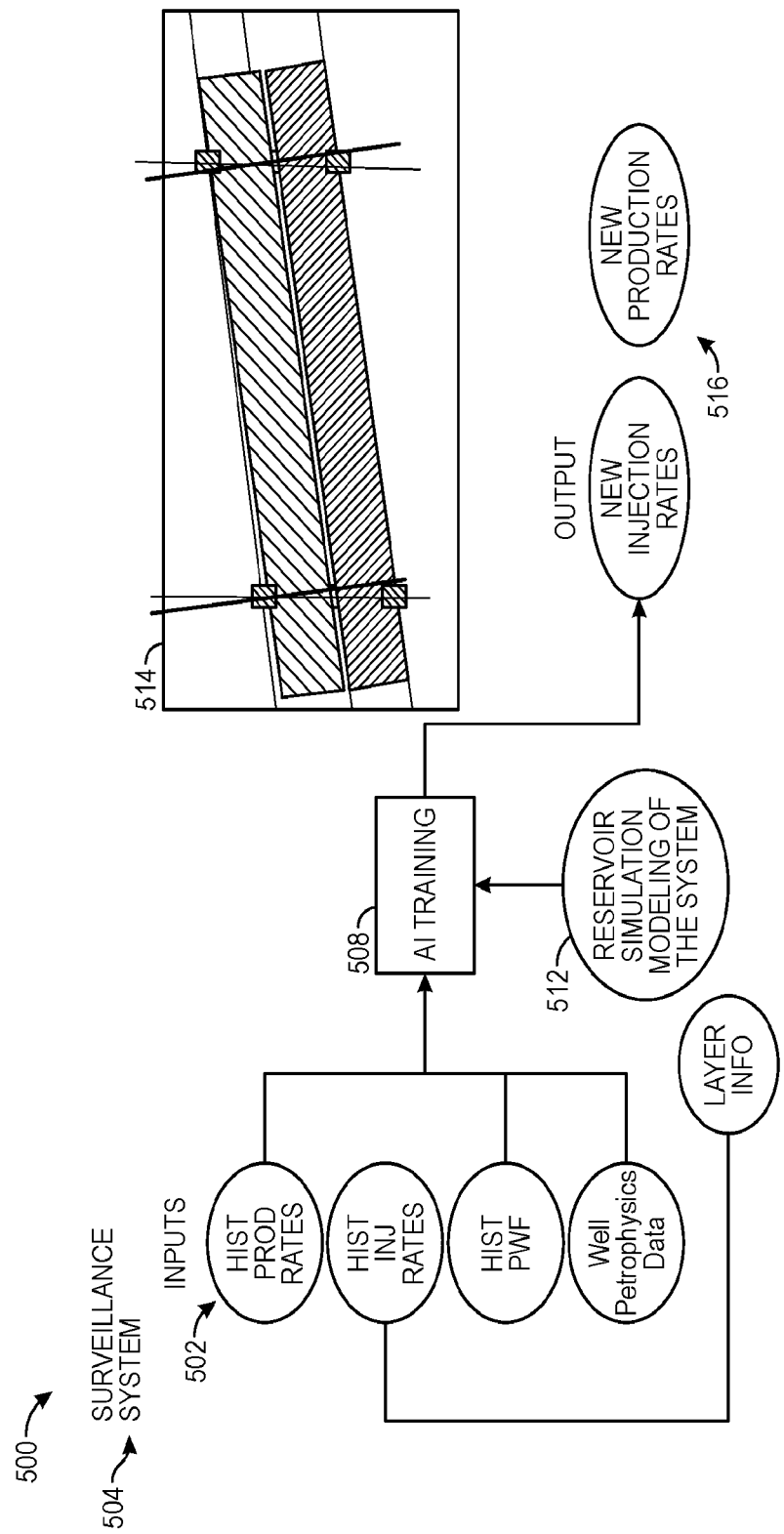
FIG. 5 illustrates a workflow that may be implemented by a system, according to an embodiment.

FIG. 5 illustrates a workflow 500 that may be implemented by a system (e.g., an embodiment of the system 400 discussed above), according to an embodiment. The workflow 500 may begin by receiving inputs 502, e.g., from a surveillance system 504 that collects and/or stores data, e.g., from a field. Such data may include historical production rates, injection rates, average bottom flowing pressure for oil wells (pwf), well petrophysical data, and layer (geological or lithological) information. The inputs 502 may be fed to an AI training module 508, which may be part of the tuning module 404 discussed above with reference to FIG. 4A. These inputs represent data collected from a subterranean volume.

The AI training module 508 may also receive reservoir simulation modeling of the subterranean system, as indicated at 512. Such modeling may be the output of physics-based models, which may be constructed and simulated based on the inputs 502. The AI training module 508 may thus update a proxy model 514 that represents the subterranean volume. As a result, when new inputs 502 are acquired, the proxy model can be updated by training and/or used to predict outputs 516 of the physics-based model, e.g., without simulating the physics-based model. As shown, by way of example, such outputs may include new injection rates and/or new production rates, based on the new inputs 502.

Figure 6:
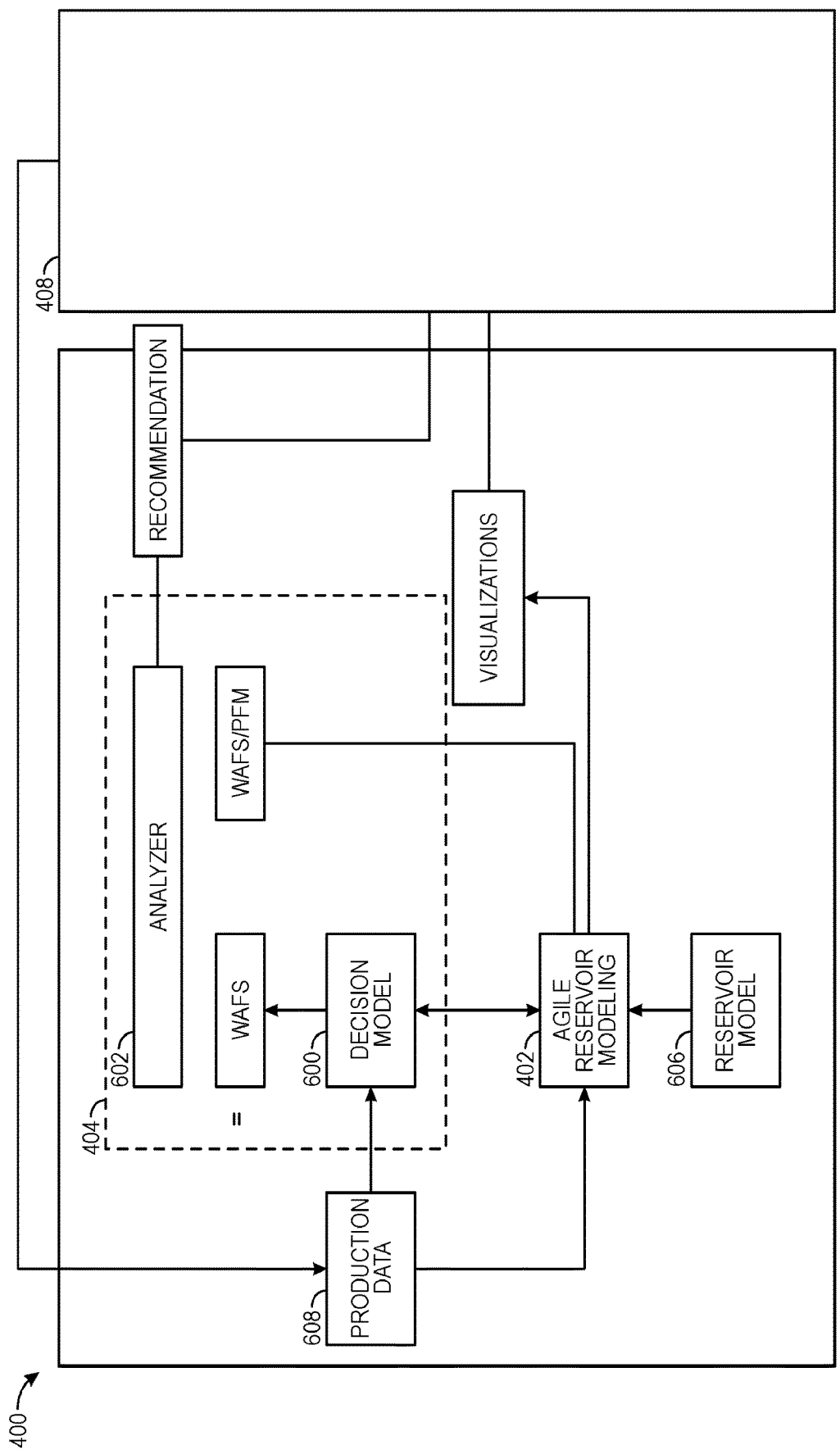
FIG. 6 illustrates another diagrammatic view of the system, according to an embodiment.

FIG. 6 illustrates another diagrammatic view of the system 400, according to an embodiment. The decision model 600 may be contained in the tuning module 404, e.g., functioning as the proxy model that is trained using a reservoir model 606 (contained in the module 402) to make determinations/recommendations for parameter values based on production data (input, as received from the tuning module 404). The agile reservoir modeling module 402 (also shown in FIG. 4A), may communicate with the reservoir model 606, and includes functionality to automatically build the static model and the dynamic model, and to calibrate the model 606 with historical pressure-production data. The reservoir model 606 may also be analyzed to determine the confidence factor at various regions in the reservoir model 606. The reservoir model 606 may have multiple realizations.

In addition, the tuning module 404 includes an analyzer 602. The analyzer 602 may also be part of the tuning module 404, and may convert well allocation factors (WAFs) and pattern flood management (PFM) into recommended actions, which may be visualized in the surveillance dashboard module 408, potentially along with other metrics and/or performance indicators. These performance indicators may be monitored and/or acted upon by an operations team of human users and/or employed to tune operating parameters of automated systems, e.g., based on receipt of production data 608 (e.g., the data and engine service module 406 of FIG. 4A and/or the inputs 502 of FIG. 5) from the field.

Figure 7:
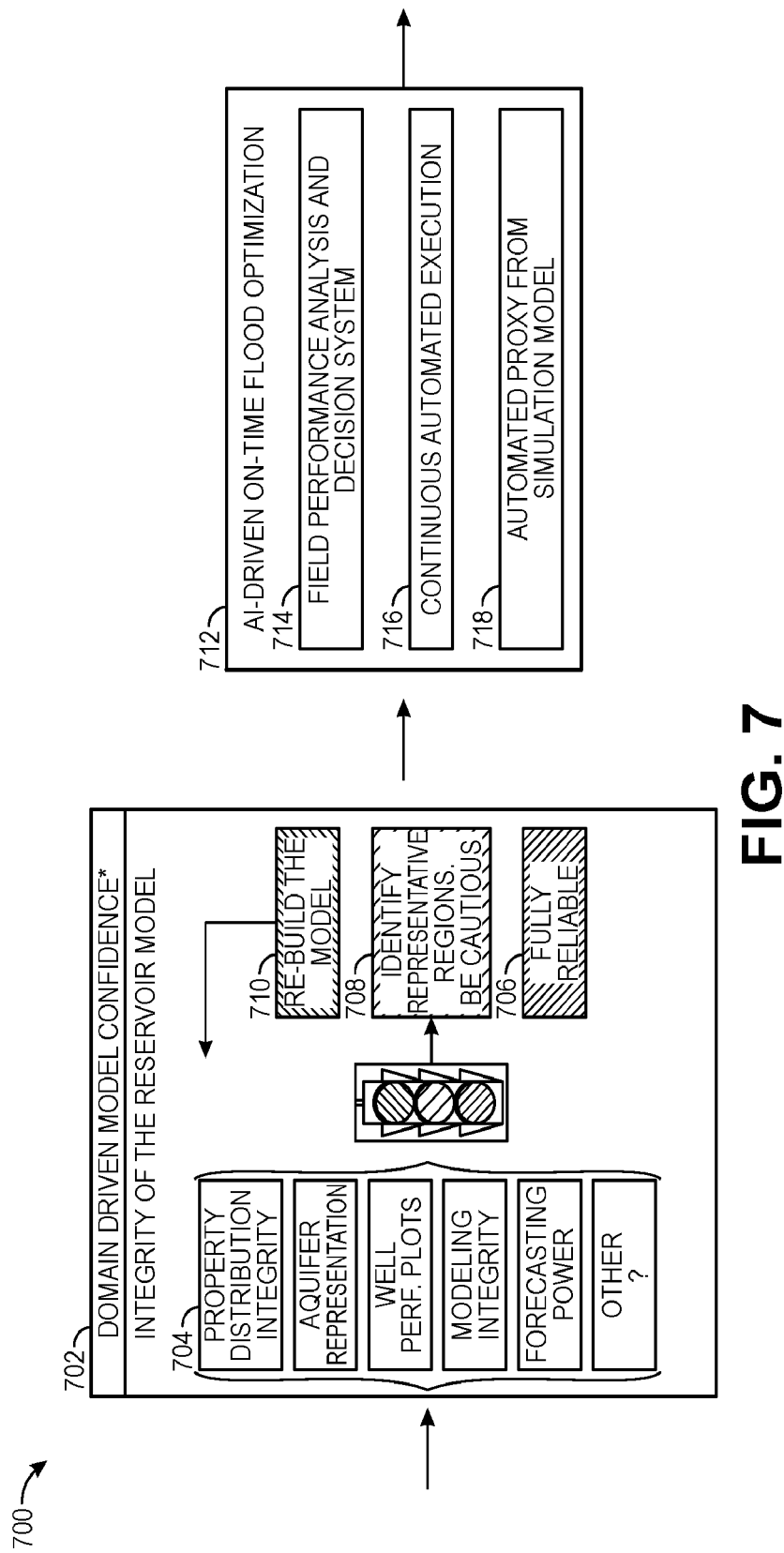
FIG. 7 illustrates a diagrammatic view of a workflow for controlling parameters in an oilfield production operation, according to an embodiment.

FIG. 7 illustrates a diagrammatic view of a workflow 700 for controlling parameters in an oilfield production operation, e.g., using a proxy or "decision" model along with a physics-based reservoir model, according to an embodiment. The workflow 700 includes an implementation of the tuning module 404, as discussed above with reference, e.g., to FIG. 4A, which includes the proxy model.

The workflow 700 may include evaluating an integrity of the reservoir model 702. For example, the reservoir model may be employed to determine various outputs 704, such as property distribution integrity, aquifer representations, well perforation plots, modeling integrity, forecasting power, and any other metrics or parameters. The reservoir model may be reviewed for integrity, e.g., based on these factors. The evaluation of the reservoir may permit a determination of a confidence level for the model. For example, the model may be deemed fully reliable 706, partially representative 708 (e.g., in certain areas or for certain aspects, but not others), or unreliable 710, and thus rebuilt.

Once the reservoir model is validated for integrity, the workflow 700 may then include providing an AI-driven on-time flood "optimization" (e.g., enhancement, increase in accuracy/efficiency, etc.) 712 based on the reservoir model. For example, the workflow 700 may include providing a field performance analysis and decision system 714, which may review field performance data and make or suggest reservoir investigation decisions. The optimization 712 may also provide for continuous automated execution 716, which may prepare simulation instructions for new reservoir models (e.g., adjust parameters thereof). The optimization 712 may also provide automated proxy from simulation models, as at 718, which may convert model outputs for use in the operation room, and, e.g., into instructions for parameter adjustment of equipment in the field.

Embodiments of the present disclosure may provide a system for reservoir management, e.g., under waterflood. Confidence that the correct field operational actions are being carried out to increase the efficiency of the operations (e.g., waterflooding), efficient use of resources and production objectives for the field development. Further, the system may provide for surveillance, diagnostics and operational control of ongoing waterflood operations. Work of field development planning (e.g., waterflood design, infill well planning) is not connected to operational data and out of date. The system may also address issues with model building and selecting the right model for decisions, which can be slow and manual by providing an automated, machine-learning process.

In particular, embodiments of the present disclosure may provide representative models that preserve uncertainties in areas of lower confidence. Further, the reservoir models are "living" in that they are configured to be updated regularly. On-time adjustment may also be provided based on the decision or "proxy" model, which can complete evaluations in tens of seconds rather than hours or more.

Figure 8:
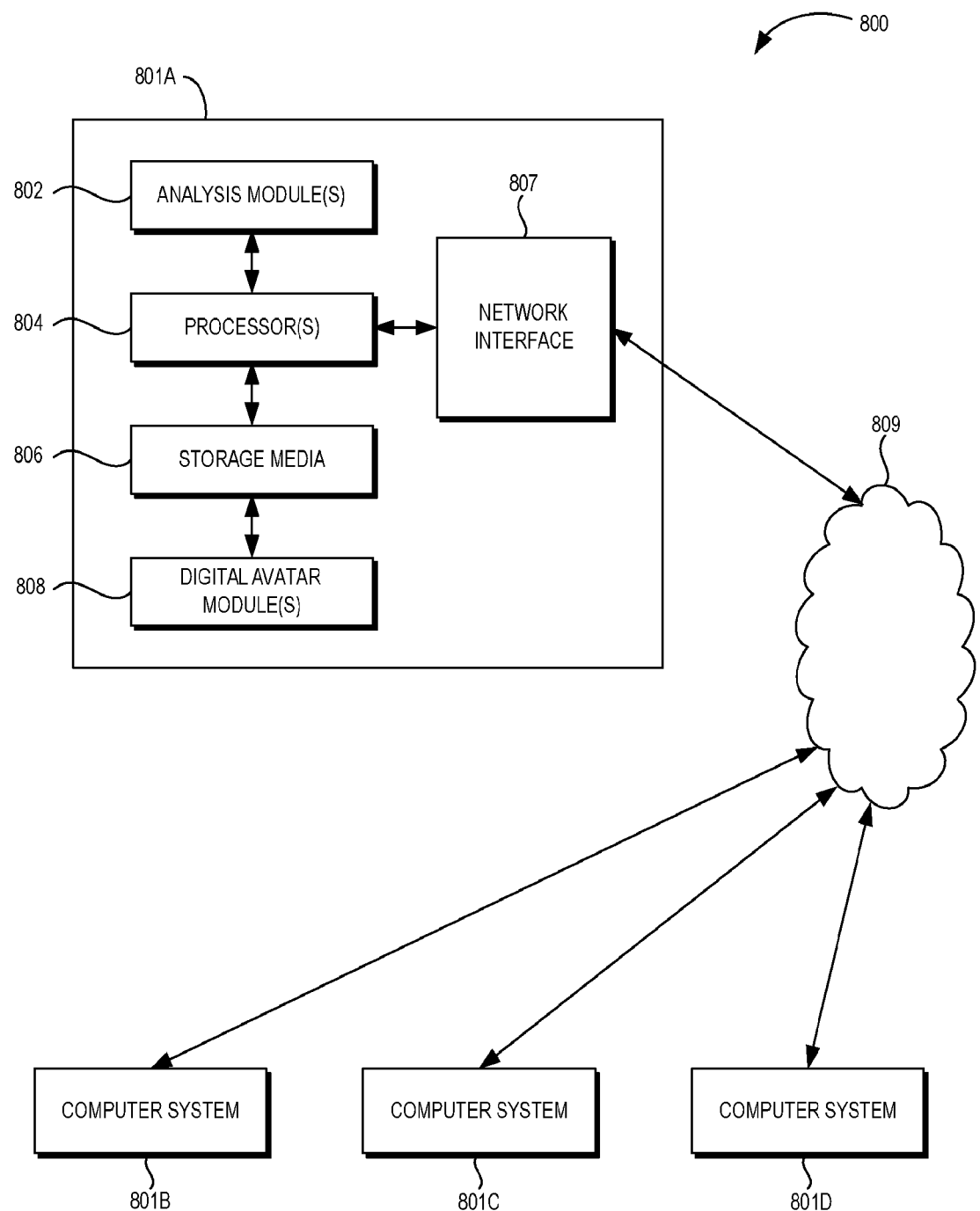
FIG. 8 illustrates a schematic view of a computing system, according to an embodiment.

In some embodiments, the methods of the present disclosure may be executed by a computing system. FIG. 8 illustrates an example of such a computing system 800, in accordance with some embodiments. The computing system 800 may include a computer or computer system 801A, which may be an individual computer system 801A or an arrangement of distributed computer systems. The computer system 801A includes one or more analysis modules 802 that are configured to perform various tasks according to some embodiments, such as one or more methods disclosed herein. To perform these various tasks, the analysis module 802 executes independently, or in coordination with, one or more processors 804, which is (or are) connected to one or more storage media 806. The processor(s) 804 is (or are) also connected to a network interface 807 to allow the computer system 801A to communicate over a data network 809 with one or more additional computer systems and/or computing systems, such as 801B, 801C, and/or 801D (note that computer systems 801B, 801C and/or 801D may or may not share the same architecture as computer system 801A, and may be located in different physical locations, e.g., computer systems 801A and 801B may be located in a processing facility, while in communication with one or more computer systems such as 801C and/or 801D that are located in one or more data centers, and/or located in varying countries on different continents).

A processor may include a microprocessor, microcontroller, processor module or subsystem, programmable integrated circuit, programmable gate array, or another control or computing device.

The storage media 806 may be implemented as one or more computer-readable or machine-readable storage media. Note that while in the example embodiment of FIG. 8 storage media 806 is depicted as within computer system 801A, in some embodiments, storage media 806 may be distributed within and/or across multiple internal and/or external enclosures of computing system 801A and/or additional computing systems. Storage media 806 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLURAY® disks, or other types of optical storage, or other types of storage devices. Note that the instructions discussed above may be provided on one computer-readable or machine-readable storage medium, or may be provided on multiple computer-readable or machine-readable storage media distributed in a large system having possibly plural nodes. Such computer-readable or machine-readable storage medium or media is (are) considered to be part of an article (or article of manufacture). An article or article of manufacture may refer to any manufactured single component or multiple components. The storage medium or media may be located either in the machine running the machine-readable instructions, or located at a remote site from which machine-readable instructions may be downloaded over a network for execution.

In some embodiments, computing system 800 contains one or more data avatar module(s) 808. In the example of computing system 800, computer system 801A includes the data avatar module 808. In some embodiments, a single data avatar estimation module may be used to perform some aspects of one or more embodiments of the methods disclosed herein. In other embodiments, a plurality of data avatar modules may be used to perform some aspects of methods herein.

It should be appreciated that computing system 800 is merely one example of a computing system, and that computing system 800 may have more or fewer components than shown, may combine additional components not depicted in the example embodiment of FIG. 8, and/or computing system 800 may have a different configuration or arrangement of the components depicted in FIG. 8. The various components shown in FIG. 8 may be implemented in hardware, software, or a combination of both hardware and software, including one or more signal processing and/or application specific integrated circuits.

Further, the steps in the processing methods described herein may be implemented by running one or more functional modules in information processing apparatus such as general purpose processors or application specific chips, such as ASICs, FPGAs, PLDs, or other appropriate devices. These modules, combinations of these modules, and/or their combination with general hardware are included within the scope of the present disclosure.

Computational interpretations, models, and/or other interpretation aids may be refined in an iterative fashion; this concept is applicable to the methods discussed herein. This may include use of feedback loops executed on an algorithmic basis, such as at a computing device (e.g., computing system 800, FIG. 8), and/or through manual control by a user who may make determinations regarding whether a given step, action, template, model, or set of curves has become sufficiently accurate for the evaluation of the subsurface three-dimensional geologic formation under consideration.

The foregoing description, for purpose of explanation, has been described with reference to specific embodiments. However, the illustrative discussions above are not intended to be exhaustive or limiting to the precise forms disclosed. Many modifications and variations are possible in view of the above teachings. Moreover, the order in which the elements of the methods described herein are illustrate and described may be re-arranged, and/or two or more elements may occur simultaneously. The embodiments were chosen and described in order to best explain the principles of the disclosure and its practical applications, to thereby enable others skilled in the art to best utilize the disclosed embodiments and various embodiments with various modifications as are suited to the particular use contemplated.

What is claimed is:

1. A method comprising:
constructing a reservoir model of a subterranean volume;
training a proxy model based upon the reservoir model;
receiving new data representing an oilfield operation performed at least partially in the subterranean volume;
predicting a reservoir model output for the oilfield operation based upon the new data using the proxy model, wherein the reservoir model output is predicted without running or simulating the reservoir model;
determining a performance indicator based upon the reservoir model output;
selecting an operating parameter for the oilfield operation based upon the performance indicator;
updating the proxy model based upon the operating parameter to produce an updated proxy model, wherein the updated proxy model predicts a new reservoir model output; and
generating or transmitting a signal in response to the performance indicator or the operating parameter, wherein the signal adjusts the operating parameter of equipment, and wherein the equipment is used to perform the oilfield operation.

2. The method of claim 1, further comprising visualizing the performance indicator in a dashboard.

3. The method of claim 1, wherein the oilfield operation comprises a waterflooding operation, an infill operation, or both.

4. The method of claim 1, wherein the proxy model comprises a machine learning model, and wherein the reservoir model comprises a physics-based, numerical model.

5. The method of claim 1, further comprising:
comparing one or more outputs of parameters calculated by the proxy model, the reservoir model, or both to one or more measurements of the parameters in the oilfield operation;
determining whether to validate or update the proxy model, the reservoir model, or both based on the comparing; and
in response to the determining, validating or updating the proxy model, the reservoir model, or both.

6. The method of claim 1, wherein the operating parameter comprises a choke position, an injection rate, or both.

7. The method of claim 1, wherein the oilfield operation comprises a waterflooding operation, and wherein the new data comprises an injection rate, an injection pressure, a choke position, a production rate, a production pressure, and a change in geological conditions.

8. The method of claim 1, wherein the new data comprises an injection pressure, wherein the reservoir model output comprises a production rate from a production well, wherein the reservoir model output also comprises injection schemes that enhance production under a set of constraints, wherein the constraints comprise a bottom hole pressure and a reservoir pressure, and wherein the oilfield operation comprises a waterflooding operation.

9. The method of claim 1, wherein the performance indicator comprises conformance, voidage replacement, maps, injection efficiency curves, and pressure production plots.

10. The method of claim 1, further comprising updating the reservoir model based at least in part on the new data to produce an updated reservoir model, wherein the reservoir model is updated less frequently than the proxy model.

11. The method of claim 10, further comprising retraining the updated proxy model based upon the updated reservoir model.

12. A computing system, comprising:
one or more processors; and
a memory storing instructions that, when executed by at least one of the one or more processors, cause the computing system to perform operations comprising:
constructing a reservoir model of a subterranean volume;
training a proxy model based upon the reservoir model;
receiving new data representing an oilfield operation performed at least partially in the subterranean volume;
predicting a reservoir model output for the oilfield operation based upon the new data using the proxy model, wherein the reservoir model output is predicted without running or simulating the reservoir model;
determining a performance indicator based upon the reservoir model output;
selecting an operating parameter for the oilfield operation based upon the performance indicator;

updating the proxy model based upon the operating parameter to produce an updated proxy model, wherein the updated proxy model predicts a new reservoir model output; and
generating or transmitting a signal in response to the performance indicator or the operating parameter, wherein the signal adjusts the operating parameter of equipment, and wherein the equipment is used to perform the oilfield operation.

13. The system of claim 12, wherein the operations further comprise visualizing the performance indicator in a dashboard.

14. The system of claim 12, wherein the oilfield operation comprises a waterflooding operation, an infill operation, or both.

15. The system of claim 12, wherein the proxy model comprises a machine learning model, and wherein the reservoir model comprises a physics-based, numerical model.

16. The system of claim 12, wherein the operations further comprise:
comparing one or more outputs of parameters calculated by the proxy model, the reservoir model, or both to one or more measurements of the parameters in the oilfield operation;
determining whether to validate or update the proxy model, the reservoir model, or both based on the comparing; and
in response to the determining, validating or updating the proxy model, the reservoir model, or both.

17. The system of claim 12, wherein the operating parameter comprises a choke position, an injection rate, or both.

18. A non-transitory computer-readable medium storing instructions that, when executed by at least one processor of a computing system, cause the computing system to perform operations, the operations comprising:
receiving data representing a subterranean volume;
constructing a reservoir model of the subterranean volume based upon the data;
training a proxy model based upon the reservoir model;
receiving new data representing an oilfield operation performed at least partially in the subterranean volume, wherein the oilfield operation comprises waterflooding, and wherein the new data comprises an injection rate, an injection pressure, a choke position, a production rate, a production pressure, and a change in geological conditions;
predicting a reservoir model output for the oilfield operation based upon the new data using the proxy model, wherein the reservoir model output comprises the production rate from a production well, wherein the reservoir model output also comprises injection schemes that enhance production under a set of constraints, wherein the constraints comprise a bottom hole pressure and a reservoir pressure, and wherein the reservoir model output is predicted without running or simulating the reservoir model;
determining a performance indicator based upon the reservoir model output, wherein the performance indicator comprises conformance, voidage replacement, maps, operations efficiency, and curve fitting;
selecting an operating parameter for the oilfield operation based upon the performance indicator, wherein the operating parameter comprises the injection rate or a position of a choke;

updating the proxy model based upon the operating parameter to produce an updated proxy model, wherein the updated proxy model predicts a new reservoir model output;

updating the reservoir model based at least in part on the new data to produce an updated reservoir model, wherein the reservoir model is updated less frequently than the proxy model;

re-training the updated proxy model based upon the updated reservoir model; and generating or transmitting a signal in response to the performance indicator or the operating parameter, wherein the signal adjusts the operating parameter of equipment, and wherein the equipment is used to perform the oilfield operation.

* * * * *